United States Patent
Tu et al.

(10) Patent No.: US 9,506,755 B2
(45) Date of Patent: Nov. 29, 2016

(54) COMPENSATING MAGNETIC INTERFERENCE FOR ELECTRONIC MAGNETOMETER SENSORS

(71) Applicant: STMicroelectronics (China) Investment Co. Ltd., Shanghai (CN)

(72) Inventors: Travis Tu, Shanghai (CN); Shu Fang, Shanghai (CN)

( * ) Notice: Subject to any disclaimer, the term of this patent is extended or adjusted under 35 U.S.C. 154(b) by 237 days.

(21) Appl. No.: 14/308,076

(22) Filed: Jun. 18, 2014

(65) Prior Publication Data

US 2015/0000145 A1 Jan. 1, 2015

(30) Foreign Application Priority Data

Jun. 20, 2013 (CN) .......................... 2013 1 0253435

(51) Int. Cl.
 *G01C 17/38* (2006.01)
 *G01C 17/28* (2006.01)
 *G01R 33/00* (2006.01)

(52) U.S. Cl.
 CPC .............. *G01C 17/38* (2013.01); *G01C 17/28* (2013.01); *G01R 33/007* (2013.01); *G01R 33/0082* (2013.01)

(58) Field of Classification Search
 CPC .................................................... G01C 17/38
 USPC .................................................. 33/357, 356
 See application file for complete search history.

(56) References Cited

U.S. PATENT DOCUMENTS

| 4,414,753 | A | * | 11/1983 | Moulin | G01C 17/38 33/356 |
|---|---|---|---|---|---|
| 4,782,453 | A | * | 11/1988 | Bauer | G01C 17/38 33/356 |
| 4,989,333 | A | * | 2/1991 | Helldorfer | G01C 17/38 33/356 |
| 5,117,375 | A | | 5/1992 | Worcester et al. | |
| 5,187,872 | A | * | 2/1993 | Dufour | G01C 17/38 324/246 |
| 5,581,899 | A | * | 12/1996 | Brehler | G01R 33/025 33/356 |
| 6,543,146 | B2 | * | 4/2003 | Smith | G01C 17/38 33/356 |
| 7,210,236 | B2 | * | 5/2007 | Sato | G01D 3/0365 33/355 R |
| 7,451,549 | B1 | * | 11/2008 | Sodhi | G01C 17/38 33/356 |
| 7,613,581 | B2 | * | 11/2009 | Skvortsov | G01C 17/38 33/356 |
| 7,891,103 | B2 | * | 2/2011 | Mayor | G01C 17/38 33/356 |
| 8,645,093 | B2 | * | 2/2014 | Brunner | G01R 33/0035 324/245 |
| 8,825,426 | B2 | * | 9/2014 | Chowdhary | G01C 17/38 702/104 |
| 2013/0060470 | A1 | * | 3/2013 | Handa | G01C 17/38 702/2 |
| 2014/0336968 | A1 | | 11/2014 | Tu et al. | |

FOREIGN PATENT DOCUMENTS

| CN | 101806595 A | 8/2010 |
|---|---|---|
| CN | 101887068 A | 11/2010 |
| CN | 102375160 A | 3/2012 |
| CN | 203587782 U | 5/2014 |

\* cited by examiner

Primary Examiner — Christopher Fulton
(74) Attorney, Agent, or Firm — Seed IP Law Group LLP

(57) ABSTRACT

Apparatus and methods to compensate hard iron and soft iron magnetic interference in magnetic sensing devices are described. Hard and soft iron interference may be modeled using an ellipsoidal surface generated by a plurality of magnetic field measurements. A displacement of the ellipsoid from a reference frame origin corresponds to hard iron or permanent magnetic field interference. A shape and orientation of the ellipsoid corresponds to soft iron magnetic field interference. The ellipsoidal surface may be analyzed to obtain magnetic field compensation values for cancelling hard iron and soft iron interference.

24 Claims, 4 Drawing Sheets

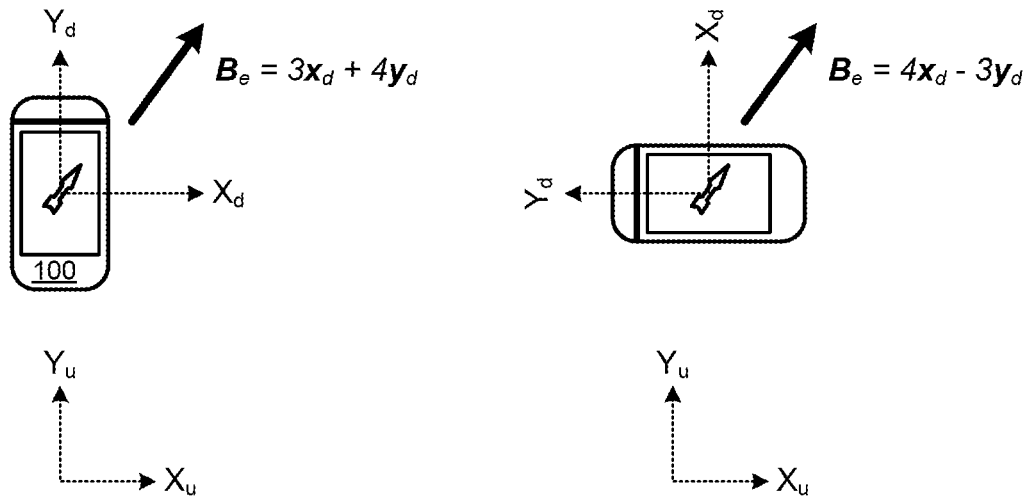
FIG. 3A
FIG. 3B
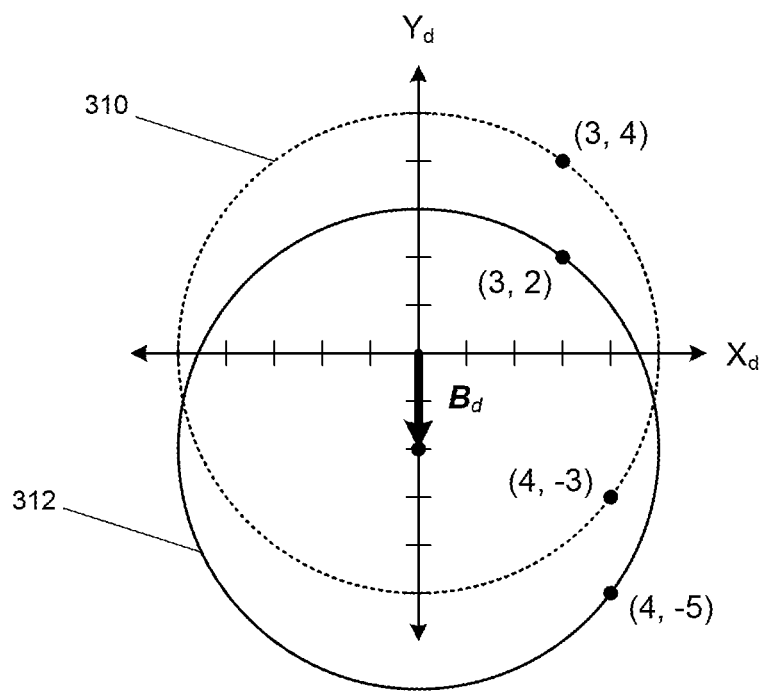
FIG. 3C

COMPENSATING MAGNETIC INTERFERENCE FOR ELECTRONIC MAGNETOMETER SENSORS

CROSS REFERENCE TO RELATED APPLICATIONS

This application claims the priority benefit of Chinese Patent application number 201310253435, filed on Jun. 20, 2013, which is hereby incorporated by reference to the maximum extent allowable by law.

BACKGROUND

1. Technical Field

The technology relates to compensating magnetic interference due to hard- and soft-iron effects, so as to improve magnetic field sensing accuracy for magnetic sensors.

2. Discussion of the Related Art

There are many hand-held portable electronic devices that provide navigational and/or device orientation functionality as an aid to users of the devices. Some smart phones are capable of providing convenient navigational displays that map a region in which a user is located, and plot a position of a user and/or path that the user has traversed within that region. Some hand-held gaming controllers or remote controllers may also use orientation functionality to provide control of a video game, computing system, or remote apparatus. In some devices, navigational or orientation functionality may be based on global-positioning system (GPS) signals. Some devices may employ an on-board magnetic field sensor for navigational and/or orientation functionality.

SUMMARY

Devices that contain magnetic sensors may be adversely affected by so-called "hard-iron" and/or "soft-iron" interferences. These types of interferences can induce errors in a magnetometer reading. Disclosed are methods and apparatus that may be used to compensate for both hard-iron and soft-iron interferences.

According to some embodiments, an electronic device configured to sense a magnetic field comprises a magnetometer configured to measure at least one value of an external magnetic field along at least one axis, and at least one processor configured to receive magnetic field data from the magnetometer. In some embodiments, the at least one processor comprises a field programmable gate array. The at least one processor may be further configured to calculate at least one parameter of an ellipsoid, wherein the magnetic field data is representative of the ellipsoid.

In some aspects, the device may further comprise a visual display. The at least one processor may be further configured to compensate, based on at least one calculated parameter, at least one measured value of the external magnetic field. The processor may cause display of a navigational aid on the visual display to a user of the device, wherein the navigational aid is based on the at least one compensated measured value. In some implementations, the navigational aid is representative of a compass heading.

According to some embodiments, at least one calculated parameter comprises a location of the center of the ellipsoid with respect to an origin of a spatial frame of reference. The spatial reference frame may be aligned to the device, in some applications.

In some aspects, the at least one processor may be further configured to determine an offset calibration parameter to compensate for a displacement of the location of the center of the ellipsoid from the origin of the spatial frame of reference. The at least one processor may be further configured to apply the offset calibration parameter to measured magnetic field data received from the magnetometer.

In some embodiments, at least one calculated parameter of the ellipsoid includes one or more radii of the ellipsoid. The at least one processor may be further configured to determine recovery calibration parameters to compensate for differences of the radii of the ellipsoid from a spherical surface. The at least one processor may be further configured to apply the recovery calibration parameters to measured magnetic field data received from the magnetometer.

In some implementations, at least one calculated parameter of the ellipsoid includes spatial orientations of the radii. The at least one processor may be configured to determine recovery calibration parameters by calculating eigenvalues of a matrix of coefficients, wherein the coefficients relate to an equation that is descriptive of an ellipsoid centered at an origin of a coordinate system.

Methods of compensating for hard- and soft-iron interference are also contemplated. According to some embodiments, a method for compensating a sensed magnetic field, wherein the magnetic field is sensed by a device having at least one processor and a magnetic sensor, comprises measuring, with a magnetic sensor, at least one value of an external magnetic field along at least one axis, and receiving, by the at least one processor, magnetic field data from the magnetometer. The at least one processor may comprise a field programmable gate array, in some implementations. The method may further comprise calculating, by the at least one processor, a center and at least one additional parameter of an ellipsoid, wherein the magnetic field data is representative of the ellipsoid. The ellipsoid may be a best numerical fit to the measured magnetic field data.

In some aspects, the method may further comprise compensating, by the at least one processor and based on the calculated center and at least one additional parameter, at least one measured value of the external magnetic field. The method may include displaying, on a visual display of the device, a navigational aid to a user of the device. The navigational aid may be representative of a compass heading, in some embodiments.

According to some embodiments, a location of the center of the ellipsoid is calculated with respect to an origin of a spatial frame of reference that is aligned to the device. The method may include determining, by the at least one processor, an offset calibration parameter to compensate for a displacement of the location of the center of the ellipsoid from the origin of the spatial frame of reference, and may further include applying, by the at least one processor, the offset calibration parameter to measured magnetic field data received from the magnetometer.

In some aspects, the at least one additional calculated parameter includes radii of the ellipsoid. The method may further comprise determining, by the at least one processor, recovery calibration parameters to compensate for differences of the radii of the ellipsoid from a spherical surface, and may include applying, by the at least one processor, the recovery calibration parameters to measured magnetic field data received from the magnetometer.

According to some embodiments, the at least one additional parameter further includes spatial orientations of the radii. In some aspects, determining recovery calibration parameters may include calculating, by the at least one processor, eigenvalues of a matrix of coefficients, wherein the coefficients relate to an equation that is descriptive of the ellipsoid.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing.

FIGS. 3A-3E depict hard-iron interference, according to some embodiments.

DETAILED DESCRIPTION

Functional features of portable consumer electronic devices, such as smart phones, personal digital assistants, tablet computers, pad computers, have increased in recent years as these devices offer more services to a user. Among the features that have become popular is navigational aid functionality, e.g., compass heading indicators, position locator, path tracker, etc. In some devices, navigational functionality may utilize magnetic field readings obtained by one or more magnetic sensors. For example, a magnetometer may be used to sense a local Earth magnetic field, and determine an orientation of the electronic device with respect to the local magnetic field.

Figure 1:
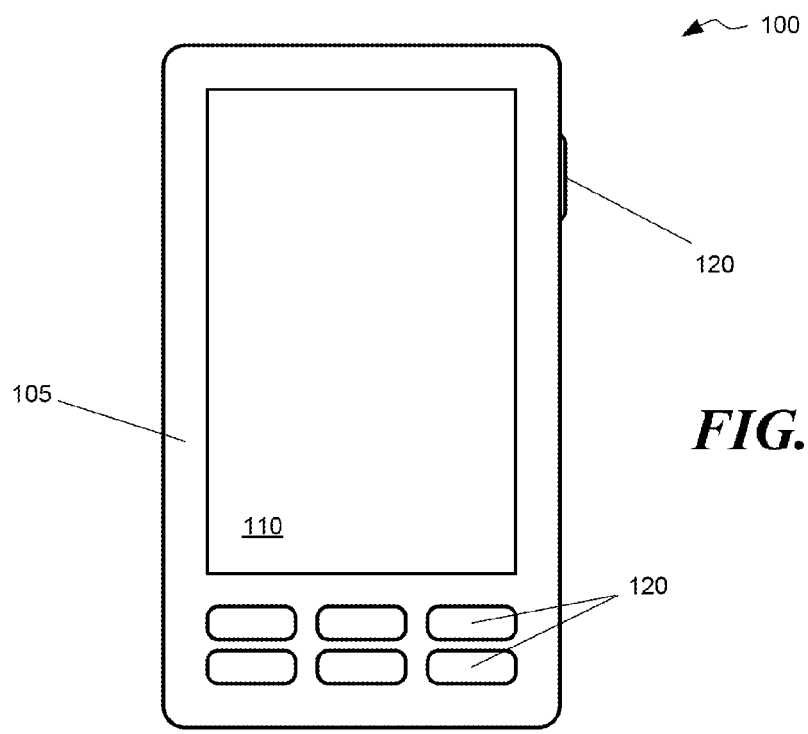
FIG. 1 illustrates an embodiment of a device that may include at least one magnetometer and be configured to sense an external magnetic field.

One example of an electronic device 100 that may include at least one magnetic sensor is shown in FIG. 1. The device shown in FIG. 1 may be a smart phone, for example, and include a visual display screen 110 and one or more push-style control buttons 120. The display screen may be configured as a touch screen. Inside a casing 105 may be electrical circuitry, hardware, at least one processor, memory storing machine-readable instructions operable on the at least one processor, and a power source (e.g., a rechargeable battery). The device 100 may further include wireless communication electronics, one or more motion-sensors, GPS circuitry, and at least one magnetometer.

In some implementations, electronic device 100 may be another type of device that includes at least one magnetometer. For example, device 100 may be a laptop computer, tablet computer, personal digital assistant, navigational device, watch, remote control, gaming controller, etc. In some cases, an electronic device 100 may not have a display screen 110 and may be in any suitable shape.

Figure 2:
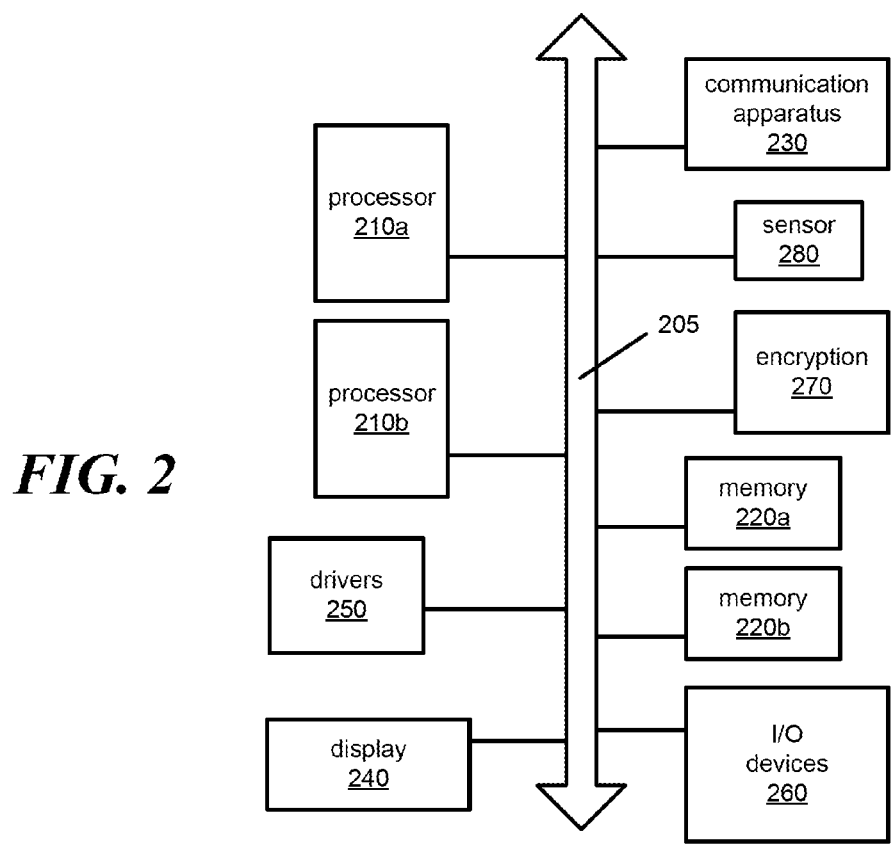
FIG. 2 depicts an embodiment of an electronic device in further detail in which compensation techniques for reducing hard-iron and/or soft-iron interferences may be implemented.

Referring now to FIG. 2, an electronic device 100 that may include at least one sensor 280 may further comprise at least one processor 210a, 210b and related hardware, as depicted in FIG. 2. The at least one processor may be configured to control and provide user interaction for operating the device. The at least one processor may be used in combination with memory devices 220a, 220b. The memory may include any type and form of RAM-type memory device and ROM-type memory device. A memory device may store machine-readable instructions that can be loaded onto and executed by the at least one processor to specially adapt the at least one processor to perform functionality defined by the machine-readable instructions. When in operation, an operating system may execute on at least one processor and provide for user interaction and operation of the electronic device 100, which may include running multiple software applications and/or programs on the device.

According to some embodiments, a processor 210a, 210b may comprise any type and form of data processing device, e.g., any one or combination of a microprocessor, microcontroller, a digital signal processor, an application specific integrated circuit (ASIC), and at least one field-programmable gate array (FPGA). There may be more than one processor in the system in some embodiments, e.g., dual core or multi-core processors, or plural processors communicating with at least one controlling processor. In some embodiments, one or more of the image processing system components may be implemented by a dedicated FPGA or ASIC.

The electronic device may further include a display 240 (e.g., comprising any one or combination of a video monitor, an LCD display, a plasma display, an alpha-numeric display, LED indicators, etc.). The electronic device 100 may further include one or more input/output devices 260 in some embodiments (e.g., keyboard, touchpad, buttons, switches, touch screen, microphone, speaker, printer), and communication apparatus 230 (e.g., networking software, networking cards or boards, wireless transceivers, and/or physical sockets). The electronic device 100 may include device drivers, e.g., software modules specifically designed to execute on the one or more processor(s) and adapt the processor(s) to communicate with and control system components. In some embodiments, the device includes encryption/decryption hardware and/or software 270 that may be used to encrypt selected outgoing data transmissions and decrypt incoming encrypted data transmissions. Components of the electronic device 100 may communicate over a bus 205 that carries data and control signals between the components. The bus may provide for expansion of the system to include other components not shown in FIG. 2.

In some embodiments, the at least one sensor 280 may include one or more magnetometers, e.g., an integrated circuit device configured to sense magnetic field along at least one axis. Any suitable type of magnetic sensor may be used in some implementations. In some embodiments, a magnetometer senses magnetic field along three orthogonal axes and generates magnetic field data representative of sensed values of magnetic field along the three axes. The at least one sensor 280 may include additional sensors, e.g., one or more accelerometers, one or more gyrometers, a photosensor array.

Many packaged devices such as that depicted in FIG. 1 may include one or more components that exhibit a so-called "hard iron" effect. A hard iron effect may be characterized by a permanent magnetic field $B_d$ that is induced locally by the one or more components. For example, the magnetic field $B_d$ may be due to permanent magnetism in a component of a motor and/or speaker located within the device 100. The magnitude and direction of $B_d$ may depend upon a location within the packaged device. In various embodiments, the local field $B_d$ in the vicinity of a magnetometer adds to, or interferes with, a sensed external magnetic field $B_e$, e.g., the Earth's magnetic field, and can yield an inaccurate reading for the magnetometer unless compensated.

FIGS. 3A-3E portray a method for detecting and compensating for a permanent magnetic field $B_d$ that is due to one or more components of a device 100. By way of introduction, FIGS. 3A and 3B depict magnetic field measurements for an ideal device that has no component that contributes a magnetic field $B_d$. In this scenario, the device 100 is configured to measure an external magnetic field $B_e$ with respect to predefined device axes $X_d$ and $Y_d$. Device axes $X_d$ and $Y_d$ may be aligned to a preferred direction of the device 100 (as depicted in the drawing, for example), and may provide a frame of reference for magnetic field measurements. In some implementations, axes $X_d$ and $Y_d$ and $Z_d$ (not shown in the drawing) may be defined by axes of a three-axis magnetometer, and the magnetometer may be aligned within the device in a preferred direction. A coordinate system defined by the axes ($X_d$, $Y_d$, $Z_d$) may then provide a frame of reference for magnetic field measurements. A user of the device 100 may be oriented with respect to user-defined axes $X_u$ (a right-side direction) and $Y_u$ (a forward direction), and $Z_u$ (an upward direction).

A first measurement of $B_e$ with the device 100 oriented as shown in FIG. 3A, may yield a reading of $B_{e,x}x_d+B_{e,y}y_d$ where $x_d$ and $y_d$ are unit vectors along the device's $X_d$ and $Y_d$ axes, respectively. The values $B_{e,x}$ and $B_{e,y}$ represent the magnitudes of the magnetic field components along the respective axes. In this example, $B_{e,x}=3$ and $B_{e,y}=4$. If the user rotates the device 90 degrees, as shown in FIG. 3B, and measures the magnetic field again, the device will return a value of $B_e=4x_d-3y_d$. If the device is rotated further and a number of measurements are made and plotted with respect to the device axes, the resulting data will be representative of a circle 310, shown as the dotted circle in FIG. 3C. Though only shown for two dimensions, it will be appreciated that in three dimensions the measured magnetic field data will be representative of a spherical shell. The radius of the sphere represents the magnitude of the external magnetic field $\|B_e\|$. Without any magnetic field interference contributed by the device components, the sphere will be centered at an origin (0, 0, 0) of a frame of reference for the device, e.g., a coordinate system defined by ($X_d$, $Y_d$, $Z_d$) as indicated in FIGS. 3A and 3C where $Z_d$ is defined by a right-hand rule.

FIGS. 3D and 3E depict a case in which components of the device 100 contribute an interfering magnetic field $B_d$. In this case, the external magnetic field $B_e$ is the same as for FIGS. 3A and 3B. The interfering magnetic field $B_d$ is arbitrarily chosen to be directed in a $-Y_d$ direction and of magnitude 2. With the device 100 oriented as in FIG. 3D, the device now incorrectly measures the external magnetic field as $B_e'=3x_d+2y_d$. With the device rotated as in FIG. 3E, the measured external magnetic field becomes $4x_d-5y_d$. If the device is rotated further and a number of measurements are made and plotted with respect to the device axes, the resulting data will trace out a circle 312 with its center shifted from the origin, which is depicted as the circle 312 in FIG. 3C. As will be appreciated from the discussion above, a three-dimensional analysis will yield a spherical shell with its center shifted from the origin. The shift from the origin represents the magnitude and direction of the interfering permanent magnetic field $B_d$.

Accordingly, when only "hard iron" magnetic interference is present, a device 100 may be rotated or moved in any suitable manner, e.g., figure-8 patterns, 10-phase, or cross-calibration gestures, so as to collect enough magnetic field data representative of a spherical shell. The data may be analyzed to determine the location of a center of the spherical shell. A resulting magnitude and direction of an inherent interfering magnetic field may be determined from the location of the shell's center, and used to calibrate or compensate subsequent magnetic measurements. In some embodiments, the magnitude and direction may be used to determine one or more offset calibration parameters that may be subtracted from subsequent magnetic readings to obtain a more accurate value of the measured magnetic field.

Figure 3F:
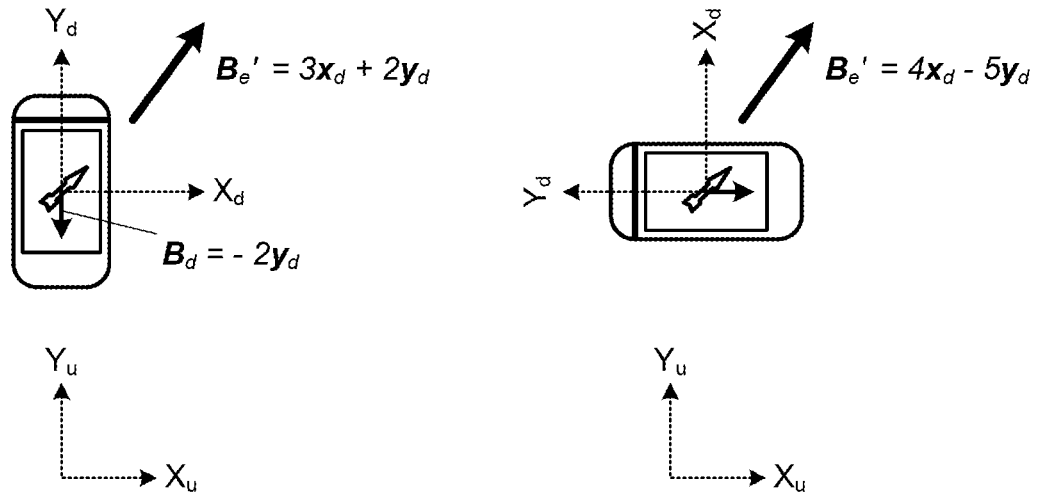
FIG. 3F depicts a combination of hard-iron and soft-iron interference, according to some embodiments.
Figure 3F:
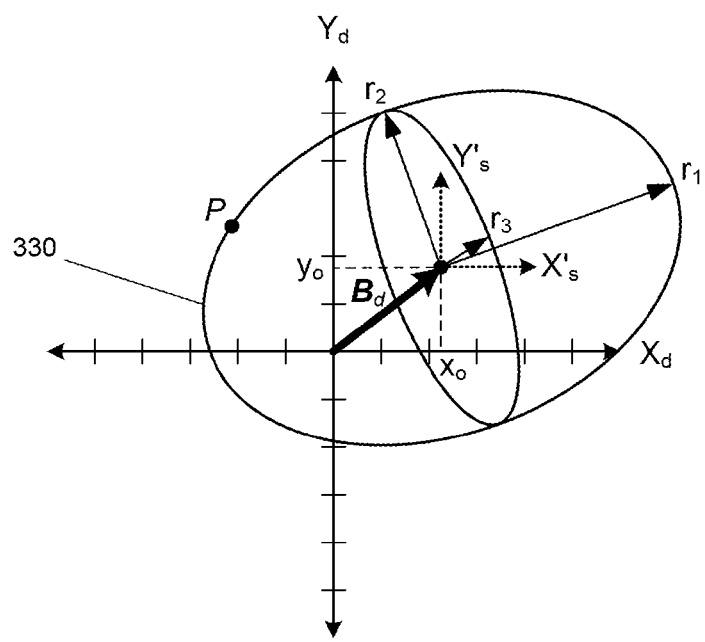

Many packaged devices such as that depicted in FIG. 1 may include one or more components that exhibit a so-called "soft iron" effect. Soft iron magnetic interference may arise from components with magnetizable material, such as Fe/Ni/Cu. Such components may distort the external magnetic field $B_e$ in the vicinity of these components due to the magnetization of these components by the external field. The amount of distortion may not be equal for every orientation of the device. For example, a magnetic permeability $\mu$ of the material may be anisotropic. With non-uniform distortion of the local magnetic field due to soft iron interference, a three-dimensional measurement of the external magnetic field with the device 100 may yield an ellipsoidal shell 330 with its center shifted from the origin, as depicted in FIG. 3F. The ellipsoidal shell may be oriented in any direction.

For analyses described below, a second frame of reference is defined for the ellipsoid. The second frame of reference is selected such that its origin is coincident with the center of the ellipsoid, and its axes ($X'_s$, $Y'_s$, $Z'_s$) are parallel to the device axes. (For clarity, the axes $Z_d$ and $Z'_s$ are not shown in the drawing, but may be implied according to a right-hand rule.)

To acquire the ellipsoidal shell 330, a device 100 having at least one magnetometer may be rotated in an orderly or random manner in a large number of directions. Magnetic field data generated by the at least one magnetometer may be recorded. The recorded magnetic field data may be representative of an ellipsoidal shell or surface, and may be plotted, stored in memory, and/or transmitted for subsequent analyses by at least one processor.

In order to remove magnetic interference from hard and soft iron effects, the three-dimensional magnetic field data can be analyzed to determine a location of the center of the ellipsoid, an orientation of the ellipsoid, and radii $r_1$, $r_2$, and $r_3$ of the ellipsoid. Once these values are determined, they may be used to calculate calibration or compensation parameters that effectively transform the measured ellipsoid to a spherical shell located at an origin of device's frame of reference defined by the device axes ($X_d$, $Y_d$, $Z_d$). Once the calibration parameters are found, they may be applied to subsequent magnetic field measurements by the device's processor to cancel effects of hard- and soft-iron interference and yield more accurate readings.

One approach to determining calibration or compensation parameters comprises numerically solving ellipsoidal equations. By way of explanation, and without intent to limit the invention to any particular theory or particular steps, a general equation for an ellipsoid may be numerically solved. With reference to FIG. 3F, a general equation for an ellipsoid 330 may be expressed as follows:

$$a_1 x^2 + a_2 y^2 + a_3 z^2 + a_4 xy + a_5 xz + a_6 yz + a_7 x + a_8 y + a_9 z = 1 \quad (1)$$

To simplify the equations, the following substitutions are made: $X_d \to x$, $Y_d \to y$, $Z_d \to z$, $X_s' \to x'$, $Y_s' \to y'$, and $Z_s' \to z'$. In some embodiments, a center of an ellipsoid 330 may be estimated by first numerically fitting EQ. 1 to measured magnetic field data to determine values for the ellipsoid coefficients $a_i$. The values for the $a_i$ are selected such that EQ. 1 best matches the measured magnetic field data. Once these coefficients are found, they may be used in the following equations to estimate the center $(x_0, y_0, z_0)$ of the ellipsoid.

$$x_0 = -\frac{a_4}{2a_1}y_0 - \frac{a_5}{2a_1}z_0 - \frac{a_7}{2a_1} \quad (2a)$$

$$y_0 = -\frac{2a_1a_6 - a_4a_5}{4a_1a_2 - a_4^2}z_0 - \frac{2a_1a_8 - a_4a_7}{4a_1a_2 - a_4^2} \quad (2b)$$

$$z_0 = -\frac{(2a_1a_9 - a_7a_5)(4a_1a_2 - a_4^2) - (2a_1a_6 - a_4a_5)(2a_1a_8 - a_4a_7)}{(4a_1a_3 - a_5^2)(4a_1a_2 - a_4^2) - 2(a_1a_6 - a_4a_5)^2} \quad (2c)$$

Once $(x_0, y_0, z_0)$ are estimated, these values may be used to compensate for "hard iron" effects. For example, $(x_0, y_0, z_0)$ may be used to obtain a magnitude and direction of a constant offset of the measured external field due to permanently magnetized components. From these values, at least one offset calibration parameter may be determined and applied to subsequently measured magnetic field data, so as to compensate for hard-iron effects. In some implementations, the calibration parameters may define a correction vector $V_c$ that is added numerically by a processor to a measured external magnetic field value, so as to cancel the permanent magnetic component contributed by the hard-iron effect. In some embodiments, applying offset calibration parameters shifts the center of the ellipsoid $(x_0, y_0, z_0)$ to the origin $(0,0,0)$ of the device's coordinate system.

Although the offset calibration parameters may compensate for hard-iron effects, "soft iron" effects still need to be compensated. Therefore, the radii and orientation of the ellipsoid that is representative of the measured magnetic field data are found with further analyses.

In some embodiments, the radii and orientation of an ellipsoid may be found by first shifting the ellipsoid 330 to be centered at the origin $(0,0,0)$ of the device coordinate system $(x, y, z)$ or a suitable selected reference frame. With reference to FIG. 3F, shifting the ellipsoid to the origin comprises making the following coordinate transformations:

$$x' = x - x_0 \quad (3a)$$

$$y' = y - y_0 \quad (3b)$$

$$z' = z - z_0 \quad (3c)$$

This transformation expresses the ellipsoid with reference to a coordinate system $(x', y', z')$ having its origin $(0,0,0)$ coincident with a center of the ellipsoid, as depicted in the drawing of FIG. 3F. In some embodiments, the values $(x_0, y_0, z_0)$ found may be used to shift the measured magnetic field data to the origin of the device coordinate system $(x, y, z)$.

EQS. 3a-3c may be used to substitute values for x, y, and z into EQ. 1. The result is the following expression for the ellipsoid.

$$a_1x'^2 + a_2y'^2 + a_3z'^2 + a_4x'y' + a_5x'z' + a_6y'z' + (2a_1x_0 + a_4y_0 + a_5z_0 + a_7)x' + (2a_2y_0 + a_4x_0 + a_6z_0 + a_8)y' + (2a_3z_0 + a_5x_0 + a_6y_0 + a_9)z' + a_1x_0^2 + a_2y_0^2 + a_3z_0^2 + a_4x_0y_0 + a_5x_0z_0 + a_6y_0z_0 + a_7x_0 + a_8y_0 + a_9z_0 = 1 \quad (4)$$

By comparing EQ. 4 with EQS. 2a-2c, the following relations are found.

$$2a_1x_0 + a_4y_0 + a_5z_0 + a_7 = 0 \quad (5a)$$

$$2a_2y_0 + a_4x_0 + a_6z_0 + a_8 = 0 \quad (5b)$$

$$2a_3z_0 + a_5x_0 + a_6y_0 + a_9 = 0 \quad (5c)$$

$$a_1x_0^2 + a_2y_0^2 + a_3z_0^2 + a_4x_0y_0 + a_5x_0z_0 + a_6y_0z_0 + a_7x_0 + a_8y_0 + a_9z_0 = 0 \quad (5d)$$

$$a_1x'^2 + a_2y'^2 + a_3z'^2 + a_4x'y' + a_5x'z' + a_6y'z' = 1 \quad (5e)$$

Thus, the equation for the ellipsoid reduces to EQ. 5e. In practice, because of the numerical fit to estimate the coefficients $a_i$, EQ. 5d may not equal 0. A residual value for EQ. 5d may lead to some inaccuracy when solving EQ. 5e. To reduce this inaccuracy, modified coefficients $d_i$ may be defined for EQ. 5e as follows.

$$d_i = \frac{a_i}{D}; i = 1, 2, 3, \ldots 6 \quad (6a)$$

$$D = 1 - (a_1x_0^2 + a_2y_0^2 + a_3z_0^2 + a_4x_0y_0 + a_5x_0z_0 + a_6y_0z_0 + a_7x_0 + a_8y_0 + a_9z_0)$$

These modified coefficients $d_i$ may then be substituted into EQ. 5e for the $a_i$ coefficients, in some embodiments.

$$d_1x'^2 + d_2y'^2 + d_3z'^2 + d_4x'y' + d_5x'z' + d_6y'z' = 1 \quad (6b)$$

In other embodiments, the residual values for EQ. 5d may be ignored and EQ. 5e may be used in the following analyses instead of EQ. 6b.

According to some embodiments, EQ. 6b is descriptive of an ellipsoid that is representative of the measured magnetic field data shifted to the origin of the device coordinate system $(x, y, z)$. EQ. 6b may be solved to find the ellipsoid's radii and orientation. According to some embodiments, EQ. 6b may be solved using eigenvalue decomposition of a symmetric matrix F that is defined as follows:

$$F = \begin{bmatrix} f_{11} & f_{12} & f_{13} \\ f_{21} & f_{22} & f_{23} \\ f_{31} & f_{32} & f_{33} \end{bmatrix} = \begin{bmatrix} d_1 & \frac{d_4}{2} & \frac{d_5}{2} \\ \frac{d_4}{2} & d_2 & \frac{d_6}{2} \\ \frac{d_5}{2} & \frac{d_6}{2} & d_3 \end{bmatrix} \quad (7)$$

The eigenvalues of the matrix F can be found by any suitable method. For example, the eigenvalues of the matrix F may be found by solving the following equation.

$$\det|F - \lambda I| = 0 \quad (8)$$

where I is the identity matrix, and $\lambda$ represents at least one eigenvalue. In some embodiments, solving EQ. 8 leads to a polynomial equation of the following form $$\lambda^3 + c_1\lambda^2 + c_2\lambda + c_3 = 0 \quad (9)$$

where the values of the coefficients $c_i$ are given by the following expressions.

$$c_1 = -(f_{11} + f_{22} + f_{33}) \quad (10a)$$

$$c_2 = f_{11}f_{22} + f_{22}f_{33} + f_{11}f_{33} - f_{12}^2 - f_{13}^2 - f_{23}^2 \quad (10b)$$

$$c_3 = f_{11}f_{23}^2 + f_{22}f_{13}^2 + f_{33}f_{12}^2 - f_{11}f_{22}f_{33} - 2f_{12}f_{13}f_{23} \quad (10c)$$

EQ. 9 may be solved using an suitable method and using the values of 10a-10c. The solutions of EQ. 9 yields three eigenvalues $\lambda_1, \lambda_2, \lambda_3$. The radii of the ellipsoid can be determined from the eigenvalues as follows.

$$r_1 = \frac{1}{\sqrt{\lambda_1}}, r_2 = \frac{1}{\sqrt{\lambda_2}}, r_3 = \frac{1}{\sqrt{\lambda_3}} \quad (11)$$

Provided the eigenvalues found are different, associated eigenvectors may be found from the following equation.

$$(F-\lambda I)V=0 \quad (12)$$

V represents at least one eigenvector that can be found by substituting into EQ. 12 an eigenvalue $\lambda_1$, $\lambda_2$, or $\lambda_3$. Solving EQ. 12 for each eigenvalue $\lambda_1$, $\lambda_2$, $\lambda_3$ provides the resulting eigenvectors $V_1$, $V_2$, $V_3$. The eigenvectors indicate a direction of the ellipsoid's major and minor axes, and thereby describe the orientation of the ellipsoid.

After the eigenvalues and eigenvectors are determined, soft iron interference may be compensated. For example, the eigenvalues and eigenvectors may be used to determine recovery calibration parameters that can be applied to subsequently measured magnetic field data to cancel soft-iron interference. The recovery calibration parameters may restore the measured ellipsoid to a spherical shell when applied. In some embodiments, the recovery calibration parameters compensate for differences of the radii of the ellipsoid from a spherical surface.

In some embodiments, the recovery calibration parameters may be used to formulate a compensating transformation that may be applied to the measured magnetic data to restore the measured ellipsoidal shell 330 to a spherical shell. In some embodiments, a compensating transformation may be embodied in the form of a matrix operation on measured data as follows $$B_c = CB_m \quad (13)$$

where $B_m$ and $B_c$ are measured and compensated vectors representative of the external magnetic field $B_e$. In some implementations, compensation may be done on a component by component basis, e.g., applying corrections to each magnetic field component $B_{m,x}$, $B_{m,y}$, $B_{m,z}$ measured along respective axes. For example, a multi-axis magnetometer may provide scalar data values for magnetic field components measured along three orthogonal axes, and corrections may be applied to each of the measured scalar values received from the magnetometer.

After compensating measured magnetic field data, a corrected value of the measured external field may be presented to a user of the device, or used in an application that relies upon sensed external magnetic field, e.g., a navigational aid application. In some implementations, a device 100 may be configured to display a compass heading, location, travel path, etc. that is based, at least in part, on the measured and compensated external magnetic field.

The methods and apparatus for compensating for hard- and soft-iron interference, as described above, may be embodied in or applied to a variety of devices, and are not limited to mobile electronic devices such as smart phones. In some applications, compensating hard- and soft-iron interference may be used in on-board or remote controllers that are configured for operating computers, video games, unmanned vehicles, autopiloted vehicles, or other types of controlled apparatus. In some implementations, some or all of the calculations for determining hard- and soft-iron calibration parameters may be executed by one or more processors in communication with the device. For example, a device may acquire magnetic field data, and transmit the data to a remote apparatus where it is processed according to one or more steps described above. Calibration results may be returned to the device.

Figure 4:
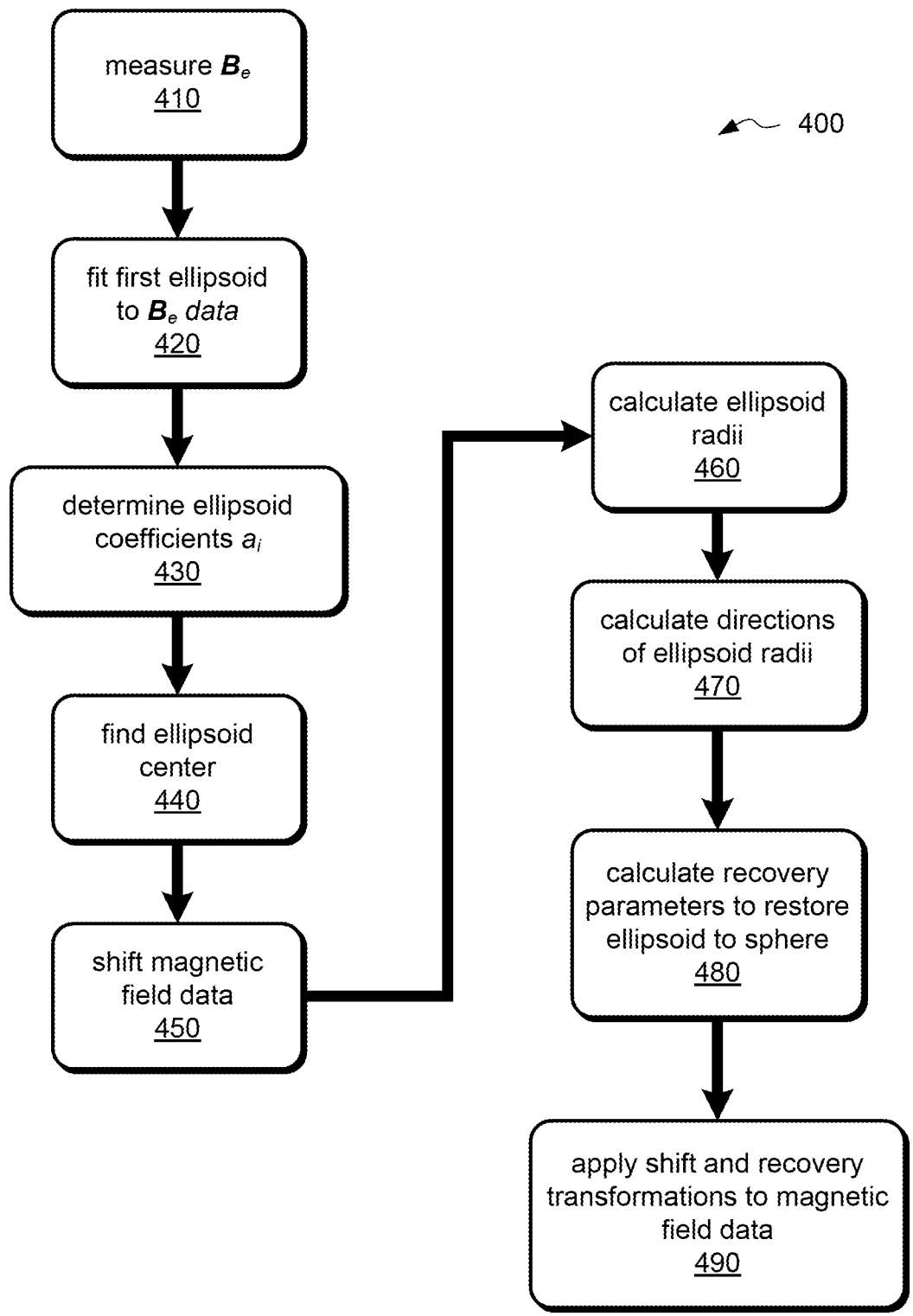
FIG. 4 depicts acts of a method for compensating hard- and soft-iron interference, according to some embodiments.

FIG. 4 depicts a method 400 for compensating hard- and soft-iron interference effects in a device having at least one processor and at least one magnetic sensor, according to some embodiments. The method may comprise measuring 410 an external magnetic field $B_e$ a plurality of times with the device oriented in a plurality of different directions. The measuring may generate magnetic field data that is representative of an ellipsoidal surface. The method 400 may further comprise fitting 420 a first ellipsoid equation to the measured data, and determining 430 ellipsoid coefficients, e.g., the $a_i$ of EQ. 1, that provide a best fit to the measured magnetic data.

The method 400 may comprise calculating 440 a center for the ellipsoid based upon the values found for the ellipsoid coefficients. The values for the center of the ellipsoid may be used to shift 450 the measured magnetic field data to an origin of a reference frame for the device. A second ellipsoid equation (e.g., an equation representative of an ellipsoid centered at an origin of a coordinate system) may be solved to calculate 460 radii of the ellipsoid and to calculate 470 directions of the radii. The calculations of the radii and respective direction may comprise finding eigenvalues and eigenvectors of a matrix associated with the second ellipsoid equation. The method 400 may further comprise calculating 480 recovery parameters from the eigenvalues and eigenvectors. The recovery parameters may be used to restore the ellipsoid to a spherical shell. In some embodiments, the method 400 further comprises applying 490 a shift and recovery transformations to subsequently measured magnetic field data.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Methods described above may be embodied as machine-readable instructions stored on at least one manufactured storage device, e.g., ROM, RAM, CD-ROM, DVD-ROM, magnetic disks, CMOS memory chips, removable memory devices, etc. The machine-readable instructions, when executed by at least one processor, particularly adapt the at least one processor to perform some or all of the acts as set forth in the methods described above.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An electronic device configured to sense a magnetic field and compensate at least one measured value, the electronic device comprising:
   a magnetometer configured to measure at least one value of an external magnetic field along at least one axis; and
   at least one processor configured to receive magnetic field data from the magnetometer and to calculate radii $r_1$, $r_2$ and $r_3$ of an ellipsoid, wherein the magnetic field data is representative of the ellipsoid, wherein the at least one processor is configured to calculate eigenvalues $\lambda_1$, $\lambda_2$, and $\lambda_3$ of a matrix of coefficients relating to an equation that is descriptive of the ellipsoid and to calculate the radii $r_1$, $r_2$, and $r_3$ of the ellipsoid as $r_1 = 1/\sqrt{\lambda_1},\ r_2 = 1/\sqrt{\lambda_2},\ r_3 = 1/\sqrt{\lambda_3},$ and wherein the at least one processor is further configured to compensate, based on the calculated radii, at least one measured value of the external magnetic field.

2. The device of claim 1, further comprising a visual display wherein the at least one processor is further configured to cause display of a navigational aid on the visual display to a user of the device.

3. The device of claim 2, wherein the navigational aid is representative of a compass heading.

4. The device of claim 1, wherein the at least one processor comprises a field programmable gate array.

5. The device of claim 1, wherein the at least one processor is further configured to calculate a location of the center of the ellipsoid with respect to an origin of a spatial frame of reference.

6. The device of claim 5, wherein the spatial reference frame is aligned to the device.

7. The device of claim 5, wherein the at least one processor is further configured to determine an offset calibration parameter to compensate for a displacement of the location of the center of the ellipsoid from the origin of the spatial frame of reference.

8. The device of claim 7, wherein the at least one processor is further configured to apply the offset calibration parameter to measured magnetic field data received from the magnetometer.

9. The device of claim 1, wherein the at least one processor is further configured to determine recovery calibration parameters to compensate for differences of the radii of the ellipsoid from a spherical surface.

10. The device of claim 9, wherein the at least one processor is further configured to apply the recovery calibration parameters to measured magnetic field data received from the magnetometer.

11. The device of claim 9, wherein the at least one processor is further configured to calculate spatial orientations of the radii.

12. The device of claim 9, wherein the at least one processor is configured to determine recovery calibration parameters by calculating eigenvalues of a matrix of coefficients, wherein the coefficients relate to an equation that is descriptive of the ellipsoid.

13. A method for compensating a sensed magnetic field wherein the magnetic field is sensed by a device having at least one processor and a magnetic sensor, the method comprising:

measuring, with a magnetic sensor, at least one value of an external magnetic field along at least one axis;

receiving, by the at least one processor, magnetic field data from the magnetometer;

calculating, by the at least one processor, a center and radii of an ellipsoid, wherein the magnetic field data is representative of the ellipsoid; and compensating, by the at least one processor, at least one measured value of the external magnetic field based on the calculated center and the calculated radii.

14. The method of claim 13, further comprising:
displaying, on a visual display of the device, a navigational aid to a user of the device.

15. The method of claim 14, wherein the navigational aid is representative of a compass heading.

16. The method of claim 13, wherein the at least one processor comprises a field programmable gate array.

17. The method of claim 13, wherein a location of the center of the ellipsoid is calculated with respect to an origin of a spatial frame of reference that is aligned to the device.

18. The method of claim 17, further comprising determining, by the at least one processor, an offset calibration parameter to compensate for a displacement of the location of the center of the ellipsoid from the origin of the spatial frame of reference.

19. The method of claim 18, further comprising applying, by the at least one processor, the offset calibration parameter to measured magnetic field data received from the magnetometer.

20. The method of claim 13, further comprising:
calculating eigenvalues $\lambda_1$, $\lambda_2$, and $\lambda_3$ of a matrix of coefficients, wherein the coefficients relate to an equation that is descriptive of the ellipsoid, wherein the radii of the ellipsoid are $r_1$, $r_2$, and $r_3$ and calculating the radii of the ellipsoid includes calculating:

$r_1 = 1/\sqrt{\lambda_1},\ r_2 = 1/\sqrt{\lambda_2},\ r_3 = 1/\sqrt{\lambda_3}.$ 21. The method of claim 20, further comprising determining, by the at least one processor, recovery calibration parameters to compensate for differences of the radii of the ellipsoid from a spherical surface.

22. The method of claim 21, further comprising applying, by the at least one processor, the recovery calibration parameters to measured magnetic field data received from the magnetometer.

23. The method of claim 21, wherein the at least one additional parameter further includes spatial orientations of the radii.

24. The method of claim 21, wherein the determining recovery calibration parameters comprises calculating, by the at least one processor, eigenvalues of a matrix of coefficients, wherein the coefficients relate to an equation that is descriptive of the ellipsoid.

* * * * *